United States Patent [19]
Codella et al.

[11] Patent Number: 4,855,246
[45] Date of Patent: Aug. 8, 1989

[54] FABRICATION OF A GAAS SHORT CHANNEL LIGHTLY DOPED DRAIN MESFET

[75] Inventors: Christopher F. Codella, Fishkill; Seiki Ogura, Hopewell Junction, both of N.Y.

[73] Assignee: International Business Machines Corporation, Armonk, N.Y.

[21] Appl. No.: 247,140

[22] Filed: Sep. 21, 1988

Related U.S. Application Data

[60] Continuation of Ser. No. 914,033, Oct. 1, 1986, abandoned, which is a division of Ser. No. 644,830, Aug. 27, 1984, Pat. No. 4,636,822.

[51] Int. Cl.$^4$ .................. H01L 29/48; H01L 29/80
[52] U.S. Cl. ..................... 437/41; 437/912; 437/984; 437/947; 437/39; 437/44; 148/DIG. 82; 148/DIG. 61; 148/DIG. 140
[58] Field of Search .......... 437/44, 41, 912, 947, 437/984; 357/23.4; 156/643

[56] References Cited

U.S. PATENT DOCUMENTS

| | | | |
|---|---|---|---|
| 4,304,042 | 12/1981 | Yeh | 357/22 |
| 4,356,623 | 11/1982 | Hunter . | |
| 4,389,768 | 6/1983 | Fowler et al. | 357/22 T |
| 4,425,573 | 1/1984 | Ristow | 357/22 |
| 4,442,589 | 3/1984 | Doo et al. . | |
| 4,455,738 | 6/1984 | Houston et al. | 357/15 |
| 4,538,342 | 9/1985 | Camlibel et al. | 357/67 |
| 4,597,824 | 7/1986 | Shinada et al. | 156/643 |
| 4,597,827 | 7/1986 | Nishitani et al. | 156/643 |

OTHER PUBLICATIONS

Rideout V. L., "Fabrication Method for High Performance MESFET", IBM Technical Disclosure Bulletin, vol. 22, No. 8B, Jan. 1980, pp. 3861-3863.
Tsang et al., "Fabrication of High Performance LDDFET's with Oxide Sidewall-Spacer Technology", IEEE Journal of Solid-State Circuits, vol. SC-17, No. 2, 1982, pp. 220-226.
Codella et al., "Submicron IGFET Device with Double Implanted Lightly Doped Drain/Source Structure", IBM Technical Disclosure Bulletin, vol. 26, No. 12, May 1984.
Codella C. F., S. Ogura, "GaAs LDD E-MESFET for Ultra-High Speed Logic", IBM Technical Disclosure Bulletin, vol. 26, No. 4, Sep. 1983, pp. 1988-1989.
Miers T. H., "Schottky Contact Fabrication for GaAs MESFET's", J. Electrochem. Soc.: Solid-State Science and Technology, vol. 129, Aug. 1982, pp. 1795-1799.
P. J. Tsang, J. F. Shepard, J. Lechaton, and S. Ogura, "Characterization of Sidewall-Spacers Formed by Anisotropic RIE", J. Electrochem. Soc., vol. 128, p. 238C, 1981.

*Primary Examiner*—Brian E. Hearn
*Assistant Examiner*—Beverly A. Pawlikowski
*Attorney, Agent, or Firm*—Yen S. Yee; T. Rao Coca

[57] ABSTRACT

Disclosed is a self-aligned GaAs, lightly doped drain metal-semiconductor field effect transistor. In one embodiment, the device consists of a shallow n$^-$ active channel region formed on a GaAs substrate, a Schottky gate overlying the n$^-$ region and highly doped and deep n$^+$ source and drain regions formed on either side of the gate. In the channel region between the gate edges and the source/drain are positioned n-type source/drain extensions which have an intermediate depth and doping concentration to minimize the device series resistance, suppress short channel effects and permit channel length reduction to submicron levels.

In a second embodiment, p-type pockets are provided under the source/drain extensions to better control the device threshold voltage and further reduce the channel length.

In terms of the method of fabrication of the first embodiment, starting with a GaAs substrate an n$^-$ semiconductor layer is formed in the device active region. Next, a Schottky gate is formed in direct contact with the n$^-$ layer. Next, a dielectric layer is deposited and reactive ion etched (RIE), forming gate sidewalls. Then, n-type source/drain extensions are formed followed by repetition of the dielectric layer deposition and RIE to enlarge the gate sidewalls. Finally, source/drain are implanted.

To form the second structure a p-type ion implantation is accomplished prior to or after the source/drain extension forming step to form the deep p-type pockets.

11 Claims, 5 Drawing Sheets

FABRICATION OF A GAAS SHORT CHANNEL LIGHTLY DOPED DRAIN MESFET

This is a continuation application of application Ser. No. 06/914,033 filed Oct. 1, 1986, now abandoned, which in turn is a divisional application of application Ser. No. 644,830, filed Aug. 27, 1984, U S. Pat. No. 4,636,822.

FIELD OF THE INVENTION

The invention relates generally to gallium arsenide (GaAs) integrated circuit technology, and more particularly, to a short channel, enhancement mode, self-aligned, lightly doped drain (LDD) GaAs metal-semiconductor field effect transistor (MESFET) structure and a process of making the same.

BACKGROUND OF THE INVENTION

The simplest and most attractive transistor for high speed and low power GaAs digital integrated circuits is the normally-off or enhancement mode MESFET (E-MESFET). Particularly in very large scale integration (VLSI) applications, the E-MESFET is desirable since, as discussed in the article by K. Suyama et al., entitled "Design and Performance of GaAs Normally-Off MESFET Integrated Circuits", IEEE Transactions on Electron Devices, Vol. ED-27, No. 6, pp. 1092–1097 (June 1980), it enables direct coupling of logic functions and can operate with a single positive power supply. The conventional E-MESFET structure is illustrated in a cross-sectional representation in FIG. 1. It consists of a semi-insulating GaAs substrate 10 having a $n^-$ layer 11 which is formed by either implanting n-type ions or by epitaxial growth. A gate electrode 12 is supported directly on the $n^-$ layer 11 between the heavily doped source 13 and drain 14 and forms a metal-semiconductor (Schottky) contact. The $n^-$ layer 11 is made sufficiently thin, typically as thin as 0.1 $\mu$m, and it is lightly doped, typically to a doping density of about $1 \times 10^{17}$ atoms/cm$^3$ to enable the normally-off operation of the device by enabling the depletion region under the Schottky gate 12 to pinch off the channel at zero gate voltage. The source 13 and drain 14 are heavily doped to insure good ohmic contact with their respective alloy contacts 15 and 16 which in turn make electrical contact with metal interconnects 17 and 18, respectively.

Due to its light doping and shallow depth the channel between the source and drain exhibits a high sheet resistivity. Consequently, the prior art MESFET suffers from a large source-drain series resistance which degrades the performance. Also, the heavy doping provided in the source and drain regions, imposes restrictions on device operation. First, it places a limitation on the maximum supply voltage due to the low drain breakdown voltage. Second, it requires the source and drain be spaced sufficiently far away from the gate edges to insure enhancement mode operation. This requirement further compounds the series resistance problem discussed above by increasing the length of the high resistivity channel region. Another disadvantage of the prior art MESFET structure is that it is not amenable to a high level of circuit integration because of the rather large device size.

SUMMARY OF THE INVENTION

It is a principal object of the present invention to provide a high performance self-aligned GaAs MESFET device having a reduced series resistance.

It is another object of the invention to provide a GaAs MESFET having a short channel length.

It is another principal object of the invention to provide a method of fabricating a GaAs MESFET structure having the above characteristics.

One embodiment of the invention is a self-aligned LDD-E-MESFET. Structurally, the device consists of a shallow $n^-$ channel region formed on a semi-insulating GaAs substrate, a Schottky metal gate overlying the $n^+$ channel region and relatively highly doped and deep $n^+$ source and drain regions formed in the substrate in a spaced-apart relationship with and on either side of the gate. In the channel regions between the gate edges and source/drain are positioned n-type source/drain extensions of an intermediate depth and doping concentration. The source/drain extensions constitute the lightly doped drain regions of the LDD MESFET and serve to minimize the device series resistance, suppress short channel effects without affecting the enhancement mode operation and permit the device channel length reduction to submicron levels.

Another embodiment of the LDD-E-MESFET which is referred to herein as double implanted lightly doped drain enhancement mode MESFET or DI-LDD-E-MESFET, for short, additionally contains deep p-type pockets under the lightly doped drain regions abutting the source/drain to enable better device threshold voltage control and thereby enable further reduction in the channel length.

In terms of the method of forming the LDD-E-MESFET, in one specific embodiment, starting with a semi-insulating GaAs substrate an $n^-$ semiconductor layer representing the device active area is formed thereon by epitaxial growth or by a low dose ion implantation. Next, a metal Schottky gate is formed in direct contact with the $n^-$ layer by blanket deposition of a metal layer followed by selective etching or by the conventional photolithography and lift-off technique. A relatively thick silicon dioxide or silicon nitride insulator layer is deposited over the structure and reactive ion etched (RIE), leaving a sidewall insulator spacer on either side of the gate. Next, using the gate and the spacer as a mask, self-aligned lightly doped source/drain extensions are formed by means of an $n^-$ type implant of an intermediate dose and energy which are higher than those used for forming the $n^-$ layer. The insulator deposition and RIE steps are repeated to enlarge the sidewall spacer on either side of the Schottky gate thereby masking a portion of the source/drain extensions. Thereafter, the structure is subjected to a high dose and energy $n^-$ type ion implantation forming deep source/drain regions abutting the source/drain extensions. Finally, ohmic contacts are made to the source and drain.

To form the DI-LDD-E-MESFET having p-type pockets underneath the lightly doped drain regions, the above process is modified to include a sufficiently high energy p-type ion implantation step prior to or after the intermediate dose and energy $n^-$ type implantation.

The novel features, steps and elements characteristic of the invention are set forth in the appended claims. The invention itself, however, will be best understood by reference to the detailed description which follows in conjunction with the accompanying drawings, wherein:

DETAILED DESCRIPTION

Figure 1:
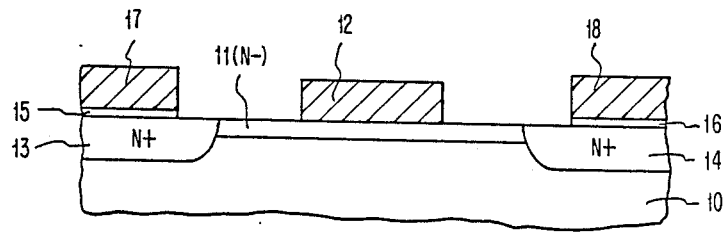
FIG. 1 is a cross-sectional view of a prior art E-MESFET structure.
Figure 2:
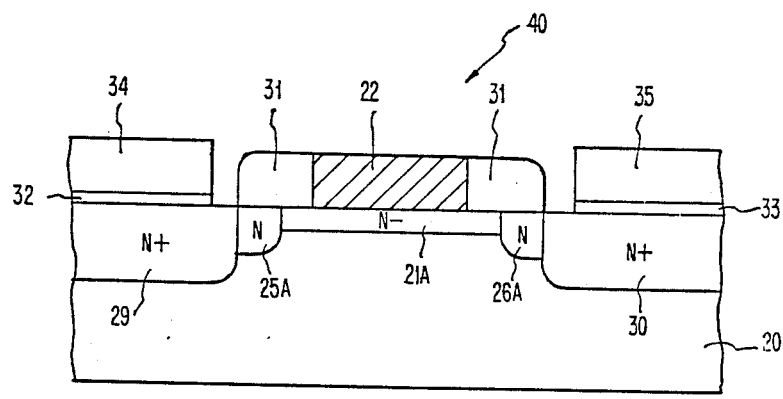
FIG. 2 is a cross-sectional representation of one embodiment of a self-aligned LDD-E-MESFET in accordance with the invention.

Referring now to the drawings and first to FIG. 2 thereof, there is shown in this Figure a partial sectional view of one embodiment of GaAs LDD-E-MESFET in accordance with the principles of the present invention. The portion of the GaAs substrate 20 includes a self-aligned gate $n^-$ channel MESFET 40 having a relatively shallow typically, less than approximately 0.1 $\mu m$ deep and low dopant concentration typically, in the range of approximately $1 \times 10^{16} - 5 \times 10^{16}$ atoms/cm$^3$ $n^-$ channel region 21A. Positioned adjacent to the channel region 21A on either side thereof are lightly doped $n^-$ type source extension 25A and drain extension 26A. The source/drain extensions 25A and 26A typically have an intermediate depth of approximately 0.10-0.20 $\mu m$ and dopant concentration in the range of about $1 \times 10^{17}$ $1 \times 10^{18}$ atoms/cm$^3$. The n+ doped source 29 and drain 30 are positioned adjacent the source extension 25A and drain extension 26A, respectively. The source 29 and drain 30 are relatively deep having a depth in the range of approximately 0.20-0.30 $\mu m$ and have a high dopant concentration exceeding about $10^{18}$ atoms/cm$^3$. Overlying the channel region 21A, in a self-aligned relationship with the source 29 and drain 30 is a metal Schottky gate 22.

Structure 40 further includes thick sidewall insulator spacers 31—31 abutting the gate 22, ohmic contacts 32 and 33 to the source 29 and drain 30, respectively, and their associated interconnecting metallization 34 and 35, respectively.

The novel LDD-E-MESFET device 40 shown in FIG. 2 has several advantageous features including a low series resistance and substantially diminished short channel effects while preserving the enhancement mode operation. The series resistance is reduced because of the higher doping concentration provided in the source region 29, drain region 30, source extension 25A and drain extension 26A relative to the $n^-$ channel region 21A and because of the self-aligned relationship of these implanted regions 25A, 26A, 29 and 30 which reduces the spacing between the gate 22 and source 29/drain 30. The short channel effects are diminished because the $n^-$ type source and drain extensions 25A and 26A, respectively, are lightly doped relative to the source n+ source 29 and drain 30 thereby preventing the drain electric field from extending into the active channel region 21A.

Figure 3:
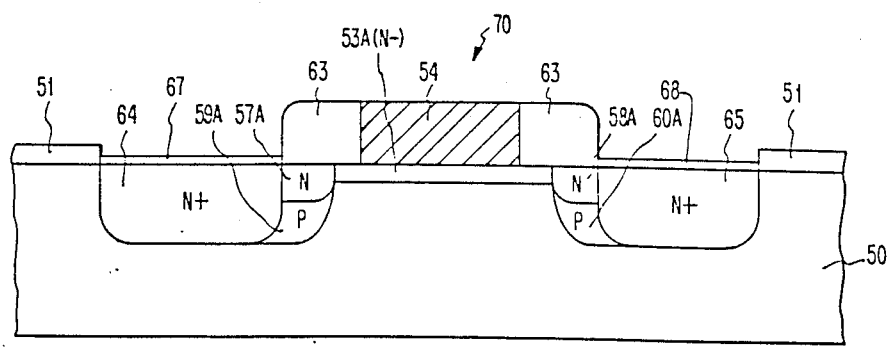
FIG. 3 is a cross-sectional representation of a second embodiment of a self-aligned DI-LDD-E-MESFET in accordance with the invention.

Referring now to FIG. 3 of the drawings, there is shown in this Figure a partial sectional view of a second embodiment of a GaAs LDD-E-MESFET. The n-channel DI-LDD-E-MESFET 70 consists of a shallow, typically, less than 1 $\mu m$ depth and very lightly doped (dopant concentration in the range of $1 \times 10^{16} - 5 \times 10^{16}$ atoms per cm$^3$) $n^-$ channel region 53A formed on a semi insulating GaAs substrate 50 having a sheet resistance of typically about 1 Meg Ohm-cm or more. Abutting the channel region 53A, in a contiguous relationship therewith are $n^-$ type lightly doped, typically, to a doping concentration of $1 \times 10^{17} - 1 \times 10^{18}$ atoms/cm$^3$ $^{and\ of}$ intermediate depth, typically, in the range 0.10-0.20 $\mu m$ source extension 57A and drain extension 58A and highly doped, typically, to a doping concentration exceeding $1 \times 10^{18}$ atoms/cm$^3$ and deep, typically, 0.20-0.30 $\mu m$ source 64 and drain 65. Provided under the source/drain extensions 57A and 58A are deep p-type pockets 59 and 60, respectively. Overlying the channel region 53A is a conductive Schottky gate 54 which is self-aligned with the source 64 and drain 65. The p-type pockets 59A and 60A prevent the device punch-through at short channel lengths and reduce the parasitic substrate current which degrades the device operation at submicron channel lengths. The p-type pockets 59A and 60A reduce the short channel effects by preventing the drain electric field from extending into the active channel region under the gate 54. The diminished short channel effects translate into improved threshold voltage control.

Structure 70 also includes highly conductive self-aligned platinum diarsenide contacts 67 and 68 to the source 64 and drain 65, respectively. The contacts 67 and 68 by virtue of their high conductivity significantly further reduce the source-drain series resistance over and beyond that possible by heavy doping of the source and drain alone.

Reference is now made to FIGS. 2A-2F wherein the successive steps of the fabrication process of the present invention are illustrated in detail. These successive steps are listed in Table I indicating the correspondence between the steps and FIGS. 2A-2F.

TABLE I

| Step No. | Description of the Process Step |
|---|---|
| 1 | Active layer definition and formation (FIG. 2A) |
| 2 | Schottky gate formation (FIG. 2B) |
| 3 | First conformal insulator layer deposition (FIG. 2C) |
| 4 | First sidewall insulator spacer definition (FIG. 2D) |
| 5 | Lightly doped, shallow n-type source-/drain extension formation (FIG. 2D) |
| 6 | Second conformal insulator layer deposition (FIG. 2E) |
| 7 | Second sidewall insulator spacer definition (FIG. 2F) |
| 8 | Source/drain formation (FIG. 2F) |
| 9 | Ohmic contact formation (FIG. 2) |

While the following description is primarily directed to the fabrication of an LDD-E-MESFET, this description is exemplary of the fabrication of a class of devices which embody the principles of the present invention. In addition, it should be noted that the thickness and other dimensions shown herein are selected for clarity of illustration and not to be interpreted in a limiting sense.

Figure 2A:
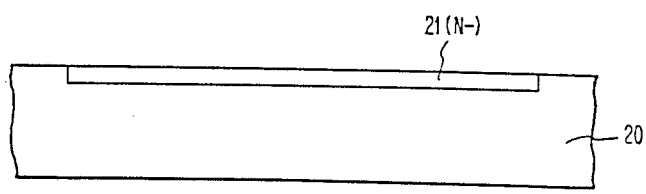
FIGS. 2A-2F are flow diagrams illustrating by sequential cross-sectional representation the process steps of the present invention culminating in the structure shown in FIG. 2.

Referring now to FIG. 2A, the fabrication process is initiated starting from a semi-insulating undoped or chromium doped GaAs substrate 20 upon which the device active area of n⁻ type conductivity is formed (Step 1). This step consists of first forming a passivation surface layer over the substrate 20 with a dielectric such as $SiO_2$ or $Si_3N_4$, removing the passivation layer by using conventional lithographic and etching techniques over the area of the substrate where the device active layer as to be formed and implanting n⁻ type ions such as silicon or germanium directly into the exposed substrate. The energy and dose of ions implanted are chosen such that the semiconducting n⁻ GaAs layer 21 resulting therefrom is shallow having a depth of approximately less than 0.1 $\mu$m and has a relatively low dopant concentration in the range of about $1 \times 10^{16}$–$1 \times 10^{17}$ atoms/cm³. The n⁻ layer 21 may also be formed by other techniques such as molecular beam epitaxy, liquid phase epitaxy, metal organic vapor epitaxy or chemical vapor deposition. For convenience of illustration in the succeeding FIGS. 2B-2F, only the portion of the substrate 20 having the layer 21 will be shown.

Figure 2B:
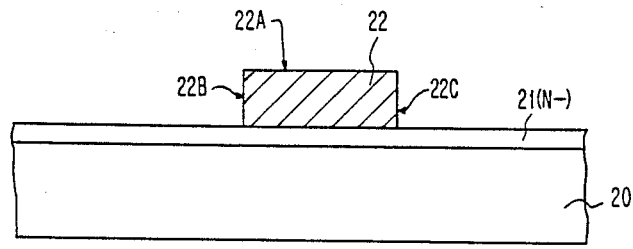

Next, referring to FIG. 2B, the Schottky gate 22 is formed at a selected location directly on the active channel layer 21 by blanket depositing a conductive material such as aluminum, titanium or titanium-tungsten and defining the gate therefrom by conventional photolithographic and etching techniques (Step 2). Alternatively, the gate 22 can be formed by the lift-off technique consisting of forming a photoresist layer over the layer 21, removing the photoresist from the region where the gate electrode is to be formed, blanket depositing a layer of conductive material over the exposed layer 21 and the remaining photoresist layer and removing the photoresist and the conductive layer thereover. The gate electrode 22 has a substantially horizontal surface designated by numeral 22A and substantially vertical surfaces 22B and 22C.

Figure 2C:
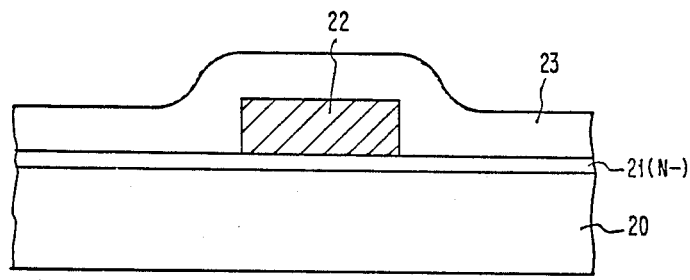

The succeeding step in the process, which is illustrated in FIG. 2C is formation of a conformal insulator layer 23 such as silicon dioxide or silicon nitride over the gate electrode 22 and the layer 21 not covered by gate 22 (Step 3). If the layer 23 is silicon dioxide, one example of forming the layer 23 is by chemical vapor deposition using silane at a low pressure and temperature. As shown in FIG. 2C, the conformal insulator layer 23 consists of substantially horizontal and vertical surfaces. The thickness of layer 23 is typically in the range 0.2–0.5 $\mu$m.

Figure 2D:
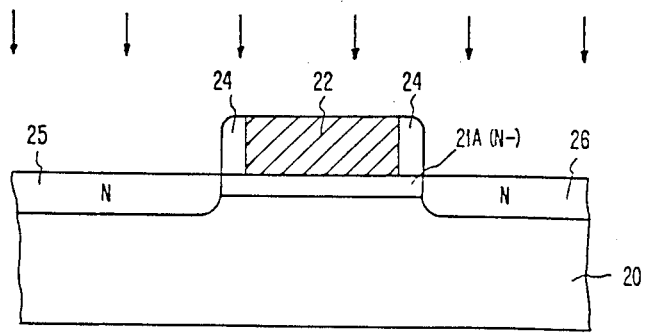

Next, the structure is subjected to anisotropic reactive ion etching (RIE) to substantially remove the insulator layer 23 from the horizontal surfaces and form the sidewall spacers 24—24 abutting the surfaces 22B and 22C of the gate 22 (Step 4). The resulting structure is shown in FIG. 2D. The sidewall spacers 24—24 are preferred to have a thickness about 0.1 $\mu$m or less. The thickness dimension is constrained by manufacturing reproducibility and by other considerations which include, on the one hand, the desirability of having thin sidewall spacers 24—24 so as to reduce both the overall MESFET device dimensions and the undesirable channel series resistance as well as the accompanying parasitic capacitance, both of which tend to limit the MESFET performance; and on the other hand, the need to have thick sidewalls 24—24 to ensure that the gate 22 (FIG. 2D) does not substantially reach the (subsequently formed) source and drain extensions (designated by numerals 25 and 26 in FIG. 2D, for example) extending beneath the sidewall spacer 24—24 as a result of lateral diffusion. The latter is important to premature break-down of the MESFET device.

Referring to FIG. 2D, the structure is now subjected to n⁻ type ion implantation in the regions of the layer 21 not masked by the gate 22 and the sidewall spacers 24—24 to form source and drain extensions 25 and 26, respectively (Step 5). The source/drain extensions 25 and 26 formed are self-aligned to the gate 22. Impurities suitable for this step include silicon and germanium. The energy and dose of the ions used in this implantation step are selected such that the source extension 25 and drain extension 26 have a doping concentration and depth higher than those of the n⁻ layer 21 (FIG. 2C) which now exists as layer 21A under the gate 22 and its abutting sidewall spacers 24—24. Typically, the source/drain extension 25 and 26 have a depth ranging from about 0.1 $\mu$m to 0.2 $\mu$m and a dopant concentration ranging from $1 \times 10^{17}$ atoms/cm³ to $1 \times 10^{18}$ atoms/cm³.

Figure 2E:
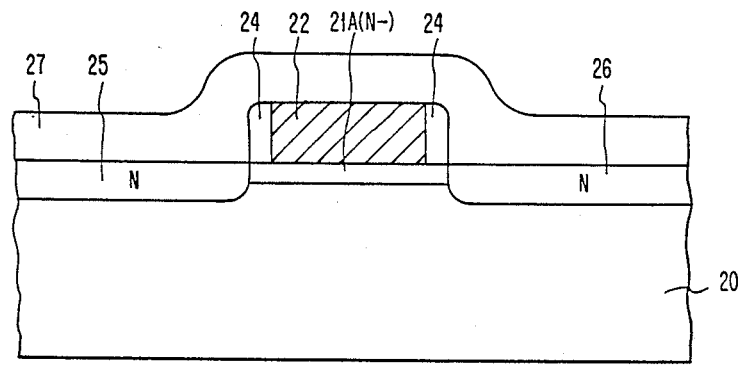

In progressing toward the structure of FIG. 2E, the next process step is formation of a conformal insulator layer 27 not only over the gate 22 and its abutting sidewall spacers 24—24, but also over the source/drain extensions 25 and 26, respectively (Step 6). This step (Step 6) is typically accomplished in the same fashion as the first conformal insulator layer formation (Step 3).

Figure 2F:
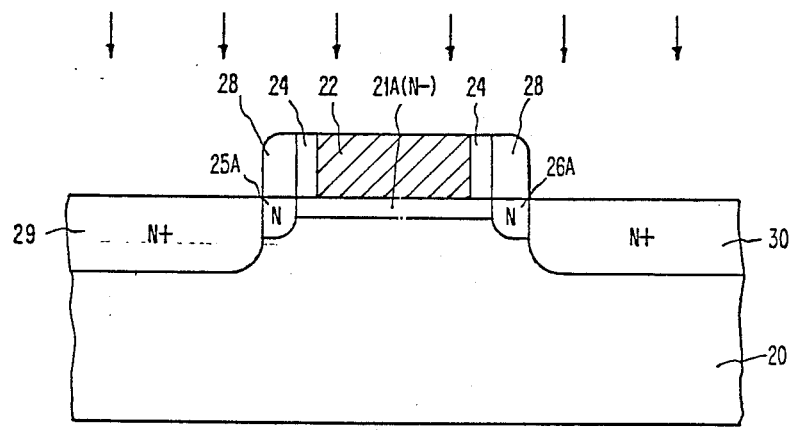

In Step 7 which is illustrated in FIG. 2F, the conformal layer 27 is subjected to a RIE process step along the lines of Step 4 to form a second sidewall spacer 28—28 abutting the previous sidewall spacer 24—24. The thickness of the sidewall spacer 28—28 is governed by the same considerations discussed above in connection with the spacer 24—24.

Once the sidewall spacer 28—28 is formed masking a portion 25A of the source extension 25 and a portion 26A of the drain extension 26 adjacent the n⁻ layer 21A, the structure is subjected to a high energy and dose n⁻ type ion implantation step (Step 8) to form the deep and heavily doped source and drain regions 29 and 30, respectively. The species for forming the source 29 and drain 30 include ions of silicon and germanium. The energy and dose of the ions used to form the source 29 and drain 30 are selected such that the depth and doping concentration of the source 29 and drain 30 exceed those of the source and drain extensions 25A and 26A, respectively.

In one specific example, using Si ion implantation, the various n⁻, n and n+ regions indicated in FIG. 2F are formed by utilizing the energy and dose indicated in the following Table II.

TABLE II

| Region Formed | Energy | Dose |
|---|---|---|
| 21A (n⁻) | 20–40 Kev | $10^{11}$–$10^{12}$ atoms/cc |
| 25A (n), 26A (n) | 60 Kev | $10^{12}$–$10^{13}$ atoms/cc |
| 29 (n+), 30 (n+) | 60–80 Kev | $10^{13}$–$10^{14}$ atoms/cc |

After implanting the source 29 and drain 30, the structure is subjected to low temperature anneal step to activate the impurities implanted not only in the source 29 and drain 30, but also those in the source extension 25A and drain extension 26A. This thermal anneal step may be accomplished at a temperature of about 800° C. either by capping the entire structure with a layer of silicon nitride or capless under an arsenic gas over pressure.

Referring now to FIG. 2 wherein 31-31 designate the combination of sidewall insulator spacers 24 and 8 (FIG. 2F) on either side of the Schottky gate 22, ohmic contacts 32 and 33 are established with the source 29 and drain 30, respectively (Step 9). Following this step is formation of the conductive interconnects 34 and 35 over the contacts 32 and 32, respectively. One example of the contact metallurgy to form contacts 32 and 33 is an alloy of gold-germanium-nickel in which gold, germanium and nickel are coevaporated over source 29 and drain 30 so that the overall composition corresponds to a desired eutectic, for example, 12 wt % Ge. A thick layer of gold, of thickness typically about ten times the thickness of the Au-Ge-Ni layer is then deposited as a top layer to form the interconnecting conductors 34 and 35. The alloying is performed by heating the structure in a hydrogen or nitrogen atmosphere to a temperature between 400°-550° C. for times ranging from 15 seconds to 5 minutes. Fast heating and cooling procedures are used t realize low resistivity contacts 32 and 33. The foregoing Au-Ge-Ni layer is formed, typically, by the conventional lift-off technique. If necessary, a barrier layer of silver may be interposed between the top gold layer and the Au-Ge-Ni to prevent diffusion of gold from the top gold layer into the bottom alloy layer.

Reference is now made to FIGS. 3A-3F wherein the successive stages of the fabrication process of the second embodiment (FIG. 3) of the present invention are illustrated in detail. These successive steps are listed in Table III indicating the correspondence between the steps and FIGS. 3A-3F. Since a number of process steps listed in Table III parallel the steps listed in Table I, in what follows the detailed description will be limited to those steps which are significantly different from the steps listed in Table I.

TABLE III

| Step No. | Description of the Process Step |
|---|---|
| 1 | Active layer definition and formation (FIG. 3A) |
| 2 | Schottky gate formation (FIG. 3B) |
| 3 | First conformal insulator deposition (FIG. 3B) |
| 4 | First sidewall insulator spacer definition (FIG. 3C) |
| 5 | Shallow n-type source/drain extension and deep p-type pocket formation (FIG. 3C) |
| 6 | Second conformal insulator deposition (FIG. 3D) |
| 7 | Second sidewall insulator spacer definition (FIG. 3E) |
| 8 | Source/drain formation (FIG. 3E) |
| 9 | Deposition of Pt and PtAs$_2$ formation (FIG. 3F) |
| 10 | Removal of unreacted Pt (FIG. 3) |

Figure 3A:
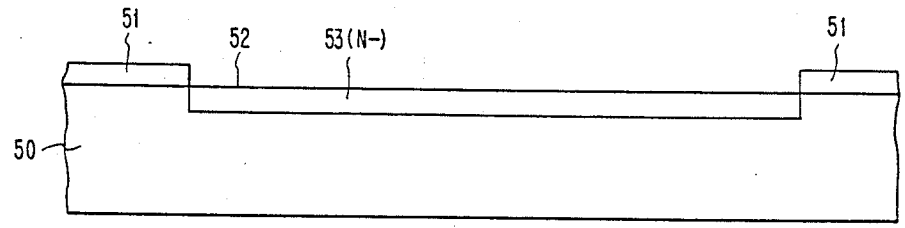
FIGS. 3A-3F are flow diagrams illustrating by sequential cross-sectional representation the process steps of the present invention culminating in the structure shown in FIG. 3.

The fabrication process of the double implanted LDD-E-MESFET 70 starts, as illustrated in FIG. 3A with forming a passivation surface layer of silicon dioxide or silicon nitride over a semi-insulating GaAs substrate 50 and defining by photolithographic and etching techniques an active area 52 of the substrate 50 (Step 1). The passivation surface layer that remains at the completion of this step is designated by numeral 51. The remnant layer 51 is left in tact to prevent subsequently formed metallization (Step 9) from being formed in the isolation regions thereunder which would occur if layer 51 were removed. Further, non$^-$ removal of the layer 51 saves a mask step which would be necessary if layer 51 were removed since the device isolation regions would be required to be appropriately protected during metallization.

Figure 3B:
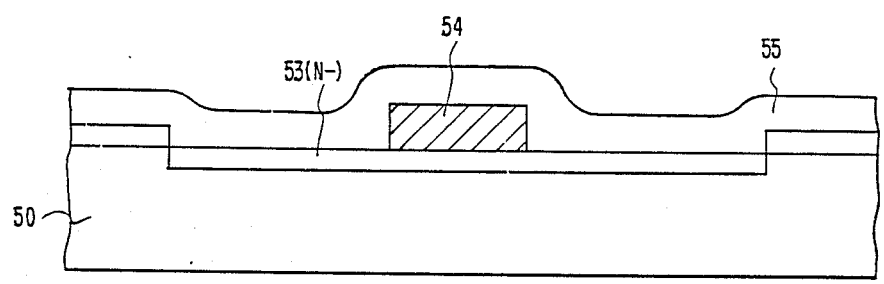
Figure 3C:
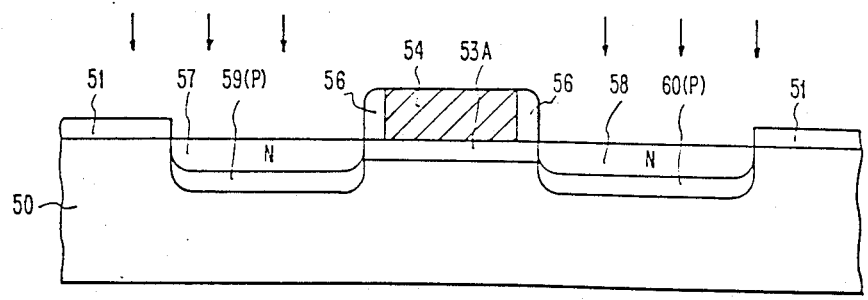

Next, referring to FIG. 3A, the shallow and low conductivity n layer 53 is formed by n$^-$ type ion implantation essentially as discussed in connection with Step 1 of Table I. Thereafter, as illustrated in FIG. 3B the Schottky gate 54 is formed over a portion of the n$^-$ layer 53 (Step 2) followed by deposition of conformal insulator layer 55 (Step 3) as discussed previously in connection with steps 2 and 3, respectively, of Table I. Next, as illustrated in FIG. 3C, the layer 55 is subjected to a RIE process step (Step 4) forming the sidewall spacers 56—56 on either side of the gate 54. This process step may be accomplished in the same fashion as step 4 of Table I.

The succeeding process step which is also illustrated in FIG. 3C is the double implantation step (Step 5) consisting of a relatively low energy and dose n$^-$ type ion implantation to form the relatively shallow n$^-$ type source and drain extensions 57 and 58, respectively, and a relatively high energy and dose p-type ion implantation to form the p-type pockets 59 and 60 extending under the source and drain extensions 57 and 58, respectively. Typical n$^-$ type implantation species include Si and Ge having a dose in the range $1 \times 10^{12} - 1 \times 10^{13}$ atoms/cc and energy of about 60 Kev. Typical p-type implantation species to accomplish step 5 include zinc and cadmium having a dose of at least about $1 \times 10^{13}$ atoms/cc and energy in the range 100-150 Kev. In this process step (Step 5), it is immaterial in what order the n$^-$ type and p-type implantations are accomplished. It should be noted that the n$^-$ type source and drain extensions 57 and 58, respectively, are of a depth and dopant concentration exceeding those of the n$^-$ channel region 53A.

Figure 3D:
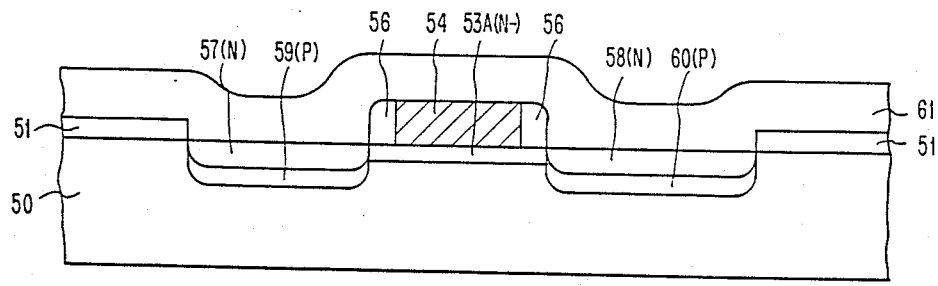
Figure 3E:
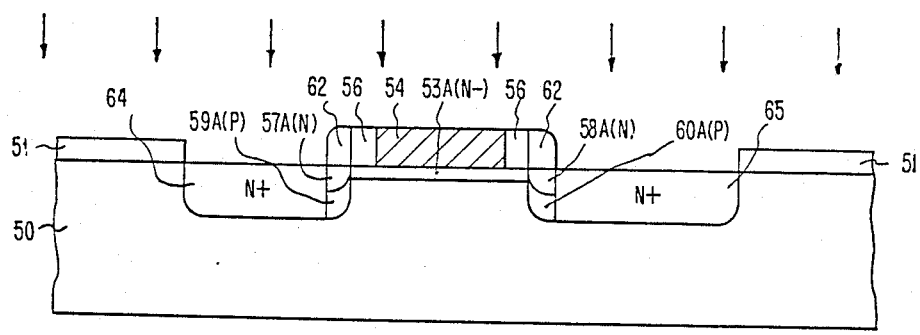

The succeeding two steps in the fabrication process which are illustrated in FIGS. 3D and 3E are formation of a second conformal insulator layer 61 over the structure (Step 6) and RIE (Step 7) to enlarge the previously existing sidewall spacers 56—56 on either side of the gate 54 by adding thereto the sidewall spacers 62—62. These process steps (Steps 6 and 7) are accomplished along the lines of the process steps 6 and 7 of Table I which were described previously in connection with FIGS. 2E and 2F, respectively. The enlarged sidewall spacer which is a combination of spacers 56 and 62 is designated by numeral 63 (FIG. 3F).

The structure is then subjected to a very high energy and dose n$^-$ type ion implantation (Step 8) to form source and drain regions 64 and 65 (FIG. 3E), respectively, analogous to the process step 8 of Table 1. During this process step, the sidewall spacers 62—62 protect portions 53A and 58A of the n$^-$ type source and drain extensions 57 and 58, respectively, and portions 59A and 60A of the p-type pockets 59 and 60, respectively, from receiving further ion implantation. The dose of the n$^-$ type ions (typically, silicon or germanium) used in this step is adjusted such that at the completion of the step, the previously p-type doped pocket regions not masked by the sidewall spacers 62 are not only compensated for, but also the resultant impurity type of the implanted regions 64 and 65 is rendered overwhelmingly n$^-$ type. The relative depths of the n$^-$ type doped regions 57A, 59A and 64 (FIG. 3E) etc., are dictated by the particular device application and the desired device characteristics. For example, if parasitic substrate current is a particular concern, making 59A deeper than 64 will help reduce it.

Figure 3F:
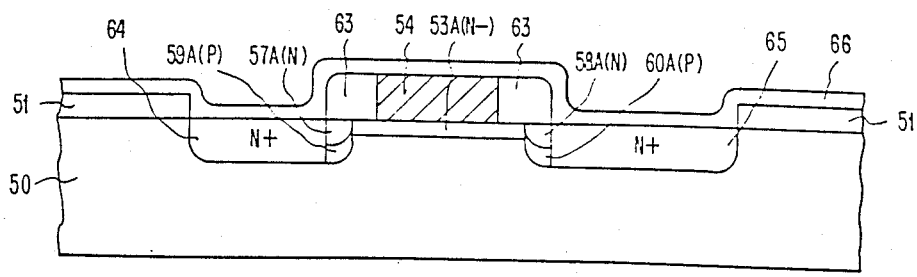

Referring to FIG. 3F, the next sequence of process steps is establishing self-aligned platinum diarsenide (PtAs$_2$) contacts with the source 64 and drain 65 (Steps 9 and 10). In step 9, platinum is blanket deposited over the entire structure forming a thin conductive layer 66 thereon. The structure is then subjected to a thermal step at a temperature of about 300° to 350° C. to react the platinum layer 66 formed over the source and drain regions 64 and 65, respectively, with the arsenic atoms in these regions forming a thin layer of platinum diarsenide. The unreacted platinum is then removed (Step 10) by etching it away in aqua regia which is a solution of water ($H_2O$), nitric acid ($HNO_3$) and hydrochloric acid (HCl) in the proportion of $H_2O:HNO_3:HCl$ of 1:1:2. The resulting structure which is illustrated in FIG. 3 consists of highly conductive, self-aligned $PtAs_2$ source and drain contacts 67 and 68, respectively.

In summary, the LDD-E-MESFET fabricated by the above novel process involving sidewall spacer technology, due to its self-aligned feature and relatively shallow, short (possibly less than 0.1 μm) and lightly doped channel and its adjacent deeper and relatively highly doped source and drain extensions, has a greatly reduced series resistance making the device particularly suitable for high speed logic applications. Another beneficial feature is that the double implanted source/drain reduces the peak electric field at the drain by spreading out the depletion region through the $n^-$ type drain extension. Consequently, the breakdown voltage is increased permitting higher drain voltage and better performance. The smaller peak electric field at the drain also results in higher mobility. The self-aligned LDD-E-MESFET structure also occupies less chip area thereby enabling a higher level of integration than hitherto possible.

The DI-LDD-E-MESFET, due to the deep p-type pockets underneath the source and drain extensions further reduces the above short channel effects by further preventing the drain electric field from extending into the active channel (i.e. region under the gate). The diminished short channel effects means better threshold voltage control, etc.

Although the invention has been described in connection with an enhancement mode MESFET, the basic structures disclosed in FIGS. 2 and 3 can be conveniently modified to form depletion mode or normally-on LDD MESFET and DI-LDD-MESFET, respectively. The depletion mode device can be formed by making the shallow $n^-$ channel regions 21A and 53A in FIGS. 2 and 3, respectively, more highly doped and/or deep. This may require an additional mask step. The resulting LDD-D-MESFET and DI-LDD-D-MESFET will have all the beneficial features discussed above in connection with their counterpart enhancement mode devices and will be suitable for high speed and low power enhancement/depletion circuit applications.

Also, the above-described specific embodiments of the invention have been set forth for purposes of illustration. It is evident that many other alternatives, modifications and variations will be apparent to those skilled in the art in light of the foregoing description. It is therefore contemplated that the appended claims will embrace any such alternatives, modifications and variations as fall within the true scope and spirit of the invention.

What is claimed is:

1. A process of forming a metal-semiconductor field effect transistor (MESFET) on a semi-insulating gallium arsenide substrate body, said process comprising:

(a) forming a relatively shallow and lightly doped layer of a first conductivity type on said substrate body;
   (b) forming a Schottky gate electrode having substantially vertical surfaces in direct contact with and over a portion of said layer;
   (c) forming a first conformal insulator layer over the gate electrode and the lightly doped layer not covered by gate;
   (d) etching directionally using reactive ion etching to remove substantially said first insulator layer leaving a narrow dimensioned first sidewalls of said insulator on said vertical surfaces of said gate;
   (e) forming source and drain extensions by implanting dopant of the first conductivity type into the portion of the lightly doped layer not covered by said gate and its first insulator sidewalls, said extensions being of a depth and dopant concentrations greater than those of the lightly doped layer;
   (f) forming a second conformal insulator layer over the resulting structure;
   (g) etching directionally using reactive ion etching to remove said second insulator layer leaving sidewalls of said second insulator abutting said first insulator sidewalls;
   (h) forming source and drain regions by implanting dopant of the first conductivity type into the exposed portions of the source and drain extensions, said source and drain regions being of a depth and dopant concentration greater than those of the source and drain extensions; and
   annealing the resulting structure at low temperature so as to activate said implanted dopants forming said source and drain regions and said source and drain extensions.

2. The method as recited in claim 1 further comprising prior to said step (f) introducing dopant of a second conductivity type into said body through the previously formed source and drain extensions of the first conductivity type to form corresponding pockets of said second conductivity type underneath said source and drain extensions, said pockets having a doping concentration greater than that of the source and drain extensions.

3. The process as recited in claim 1 wherein said first conductivity type is $n^-$ type.

4. The process as recited in claim 1 wherein said first insulator material is either silicon dioxide or silicon nitride.

5. The process as recited in claim 1 wherein said second insulator material is either silicon dioxide or silicon nitride.

6. A process of forming a metal-semiconductor field effect transistor (MESFET) on a semi-insulating gallium arsenide substrate body, said process comprising:

(a) forming an active layer of a first conductivity type on said substrate body, said layer having a relatively low depth and doping concentration;
   (b) forming a conductive gate electrode having substantially vertical surfaces in direct contact with and over a portion of said active layer;
   (c) forming a first conformal dielectric layer over the resulting structure;
   (d) etching directionally using reactive ion etching to remove substantially said first dielectric layer, forming a narrow dimensioned first dielectric sidewalls on said vertical surfaces of the gate;
   (e) forming the source and drain extensions by implanting dopant of the first conductivity type into the portion of the active layer not masked by said gate and its associated first dielectric sidewalls, said extensions being of a depth and doping concentration exceeding those of the active layer;

(f) forming pockets of a second conductivity type underneath the source and drain extension by implanting dopant of a second conductivity type into said semiconductor body via said source and drain extensions, said pockets having a doping concentration exceeding that of the source and drain extensions;

(g) forming a second conformal dielectric layer over the resulting structure;

(h) etching directionally using reactive ion etching to remove substantially said second dielectric, forming second dielectric sidewalls abutting said first dielectric sidewalls; and (i) forming source and drain regions of said first conductivity type by implanting dopant of the first conductivity type into the portions of the source and drain extensions and the underlying pockets of the second conductivity type not masked by the second dielectric sidewalls, said source and drain regions being of a depth and dopant concentration exceeding those of the source and drain extensions; and annealing the resulting structure at low temperature so as to activate said implanted dopants forming said source and drain regions, said pockets and said source and drain extensions.

7. The process as recited in claim 6, further comprising forming on said substrate body an insulator layer surrounding said active layer.

8. The process as in claim 6 wherein said first conductivity type is n⁻ type.

9. The process as in claim 6 wherein said first conformal layer is either silicon dioxide or silicon nitride.

10. The process as in claim 6 wherein said second conformal layer is silicon dioxide or silicon nitride.

11. The process as recited in claim 7 further comprising following said step (i):

forming a layer of platinum over the resulting structure;

subjecting said structure to a low temperature heating step to react the bottom portion of the platinum layer in contact with said source and drain regions thereby forming self-aligned platinum diarsenide ohmic contacts with said source and drain regions; and removing the unreacted platinum.

* * * * *